US009188397B2

(12) United States Patent
Jindo et al.

(10) Patent No.: US 9,188,397 B2
(45) Date of Patent: Nov. 17, 2015

(54) DENSE COMPOSITE MATERIAL, METHOD FOR PRODUCING THE SAME, AND COMPONENT FOR SEMICONDUCTOR PRODUCTION EQUIPMENT

(71) Applicant: NGK Insulators, Ltd., Nagoya (JP)

(72) Inventors: Asumi Jindo, Okazaki (JP); Katsuhiro Inoue, Ama-Gun (JP); Yuji Katsuda, Tsushima (JP)

(73) Assignee: NGK Insulators, Ltd., Nagoya (JP)

( * ) Notice: Subject to any disclaimer, the term of this patent is extended or adjusted under 35 U.S.C. 154(b) by 75 days.

(21) Appl. No.: 14/190,531

(22) Filed: Feb. 26, 2014

(65) Prior Publication Data
US 2014/0272378 A1    Sep. 18, 2014

(30) Foreign Application Priority Data
Mar. 15, 2013   (JP) ................................. 2013-052866

(51) Int. Cl.
*B32B 9/00*    (2006.01)
*B32B 9/04*    (2006.01)
(Continued)

(52) U.S. Cl.
CPC ................. *F28F 3/12* (2013.01); *B23K 1/0008* (2013.01); *B23K 1/19* (2013.01); *C04B 35/565* (2013.01); *C04B 35/5611* (2013.01); *C04B 35/5615* (2013.01); *C04B 35/58092* (2013.01); *C04B 35/645* (2013.01); *C04B 37/006* (2013.01); *F28F 21/086* (2013.01); *H01L 21/6833* (2013.01); *C04B 2235/3839* (2013.01); *C04B 2235/3843* (2013.01); *C04B 2235/3891* (2013.01); *C04B 2235/404* (2013.01); *C04B 2235/428* (2013.01); *C04B 2235/5436* (2013.01);
(Continued)

(58) Field of Classification Search
CPC ............ C04B 35/5611; C04B 35/5615; C04B 35/565; C04B 2235/3826
USPC .................. 264/332; 428/219, 446, 698, 699; 501/88, 91, 93
See application file for complete search history.

(56) References Cited

U.S. PATENT DOCUMENTS 4,729,972 A * 3/1988 Kodama et al. ................. 501/91
5,500,394 A * 3/1996 Kondakov ........................ 501/89
5,942,455 A * 8/1999 Barsoum et al. ................. 501/91

FOREIGN PATENT DOCUMENTS

| JP | 2007-261830 | * 10/2007 | .............. C04B 35/56 |
| JP | 2008-162875 | *  8/2008 | .............. C04B 35/56 |
| JP |    4809092 B |   11/2011 | |

OTHER PUBLICATIONS

Qin et al., "Microstructure Characterization and Mechanical Properties of TiSi2—SiC—Ti3SiC2 Composites prepared by Spark Plasma Sintering", Materials Transactions, vol. 47, No. 3, 2006, pp. 845-848.*

(Continued)

*Primary Examiner* — Jonathan Langman
(74) *Attorney, Agent, or Firm* — Burr & Brown, PLLC

(57) ABSTRACT

A dense composite material of the present invention contains 37% to 60% by mass of silicon carbide grains, also contains titanium silicide, titanium silicon carbide, and titanium carbide, each in an amount smaller than the mass percent of the silicon carbide grains, and has an open porosity of 1% or less. Such a dense composite material is, for example, characterized in that it has an average coefficient of linear thermal expansion at 40° C. to 570° C. of 7.2 to 8.2 ppm/K, a thermal conductivity of 75 W/mK or more, and a 4-point bending strength of 200 MPa or more.

15 Claims, 2 Drawing Sheets

(51) Int. Cl.
- B32B 13/04 (2006.01)
- B32B 19/00 (2006.01)
- A61F 13/15 (2006.01)
- C04B 35/653 (2006.01)
- C04B 35/52 (2006.01)
- C04B 35/56 (2006.01)
- F28F 3/12 (2006.01)
- C04B 35/565 (2006.01)
- C04B 35/645 (2006.01)
- B23K 1/00 (2006.01)
- B23K 1/19 (2006.01)
- C04B 35/58 (2006.01)
- C04B 37/00 (2006.01)
- F28F 21/08 (2006.01)
- H01L 21/683 (2006.01)

(52) U.S. Cl.
CPC ......... *C04B 2235/72* (2013.01); *C04B 2235/77* (2013.01); *C04B 2235/96* (2013.01); *C04B 2235/9607* (2013.01); *Y10T 428/249969* (2015.04)

(56) References Cited

OTHER PUBLICATIONS

Tang et al., "Ti3SiC2-64Volume percent SiC", Journal of Inorganic Materials, vol. 24, No. 4, 2009, pp. 821-826.*
Mogilevsky et al., "Toughening of SiC with Ti3SiC2 Particles", Journal of the American ceramic Society, vol. 89, No. 2, 2006, pp. 633-637.*
STIC Search conducted by Julia Wang, technical Searcher EIC 1700 on Jun. 18, 2015.*
U.S. Appl. No. 14/515,736, filed Oct. 16, 2014, Jindo et al.
U.S. Appl. No. 14/515,800, filed Oct. 16, 2014, Jindo et al.

* cited by examiner

DENSE COMPOSITE MATERIAL, METHOD FOR PRODUCING THE SAME, AND COMPONENT FOR SEMICONDUCTOR PRODUCTION EQUIPMENT

BACKGROUND OF THE INVENTION

1. Field of the Invention

The present invention relates to a dense composite material, a method for producing the same, and a component for semiconductor production equipment.

2. Description of the Related Art

A cooling board for dissipating heat is joined to an electrostatic chuck whose temperature becomes high in a semiconductor process. There may be a case where alumina is used as a material for the electrostatic chuck, aluminum is used as a material for the cooling board, and resin is used as a joining material. There is a large difference in coefficient of linear thermal expansion between alumina and aluminum. For example, the coefficient of linear thermal expansion of alumina is 7.9 ppm/K (RT-800° C.): Uchida Rokakuho Publishing Co., Ltd., "Seramikkusu no Butsuri (Physics of Ceramics)"), and the coefficient of linear thermal expansion of aluminum is 31.1 ppm/K (RT-800° C.: "New edition of Thermophysical Properties Handbook" edited by the Japan Society of Thermophysical Properties). In such an electrostatic chuck, since soft resin is used as the joining material, it is possible to relax stress caused by the difference in coefficient of linear thermal expansion. However, since resin is an organic material, it has characteristics that it has a low heat dissipation property, is likely to decompose at high temperatures, and is likely to degrade with time. Therefore, such an electrostatic chuck is hard to use in a high-temperature process for a long period of time. Accordingly, it has been confirmed that a metal junction is effective as a joining material having a high heat dissipation property that replaces the resin. In the metal junction, for example, aluminum, solder, silver solder, or the like is used as a joining material. However, unlike resin, metal is not soft, and it is not possible to relax stress caused by the difference in coefficient of linear thermal expansion between the electrostatic chuck and the cooling board.

In the case where a metal junction is employed for joining an electrostatic chuck and a cooling board to each other, the cooling board needs to have characteristics that it has a small difference in coefficient of linear thermal expansion from the electrostatic chuck, a high thermal conductivity in order to maintain the heat dissipation property, high denseness in order to pass a cooling liquid or cooling gas therethrough, and high strength to endure processing, installation, and the like. An example of a material that satisfies such characteristics to a certain extent is a composite material disclosed in Patent Literature 1. This composite material is a TiC base Ti—Si—C-based composite material having a phase including 1.0% to 20.0% by volume of $Ti_3SiC_2$, 0.5% to 8.0% by volume of SiC, and the balance being TiC. Since the difference in coefficient of linear thermal expansion between TiC and alumina is small, it is considered that the difference in coefficient of thermal expansion between the Ti—Si—C-based composite material containing the TiC base as a main phase of Patent Literature 1 and alumina is also small.

CITATION LIST

Patent Literature

[PTL 1] Japanese Patent No. 4809092

SUMMARY OF THE INVENTION

Although Patent Literature 1 describes that the TiC base Ti—Si—C-based composite material can fully utilize high thermal conduction possessed by TiC, in the first place, the thermal conductivity of TiC is only 31.8 W/mK ("New edition of Thermophysical Properties Handbook" edited by the Japan Society of Thermophysical Properties, Yokendo Co., Ltd., March 2008, pp. 291-294), which is not in the level that can be referred to as "high thermal conduction". Therefore, the TiC base Ti—Si—C-based composite material does not have high thermal conduction.

The present invention has been achieved to solve such problems. It is a main object of the present invention to provide a composite material which has a very small difference in coefficient of linear thermal expansion from alumina, and has sufficiently high thermal conductivity, denseness, and strength.

The present inventors have studied basic properties of a composite material obtained by forming a mixed powder containing SiC, metallic Si, and metallic Ti, and performing hot-press firing, and as a result, have found that the difference in coefficient of linear thermal expansion from alumina is very small, and thermal conductivity, denseness, and strength are sufficiently high. Thus, the present invention has been completed.

That is, a dense composite material of the present invention includes 37% to 60% by mass of silicon carbide grains; and titanium silicide, titanium silicon carbide, and titanium carbide, each in an amount smaller than the mass percent of the silicon carbide grains, wherein the dense composite material has an open porosity of 1% or less.

A joined body according to the present invention includes a first member composed of such a dense composite material, and a second member composed of alumina, the first member and the second member being joined to each other. A component for semiconductor production equipment according to the present invention includes such a joined body.

A method for producing a dense composite material according to the present invention includes (a) a step of forming a powder mixture containing 39% to 51% by mass of silicon carbide particles having an average particle size of 10 to 25 μm and at least one starting material selected so that Ti and Si are contained, in which, regarding Si originating from starting materials other than silicon carbide and Ti, the mass ratio Si/(Si+Ti) is 0.26 to 0.54, and (b) a step of sintering the powder mixture by hot pressing, in an inert atmosphere, at 1,370° C. to 1,460° C.

The dense composite material according to the present invention has a very small difference in coefficient of linear thermal expansion from alumina and has sufficiently high thermal conductivity, denseness, and strength. Consequently, a joined body in which a first member composed of such a dense composite material and a second member composed of alumina are joined to each other can be used as a component for semiconductor production equipment. Even if the component is repeatedly used at temperatures between a low temperature and a high temperature, the first member and the second member are not separated from each other, and thus, the service life is prolonged while maintaining high heat dissipation performance. Furthermore, the method for producing a dense composite material according to the present invention is suitable to produce the dense composite material described above.

DETAILED DESCRIPTION OF THE INVENTION

Figure 1:
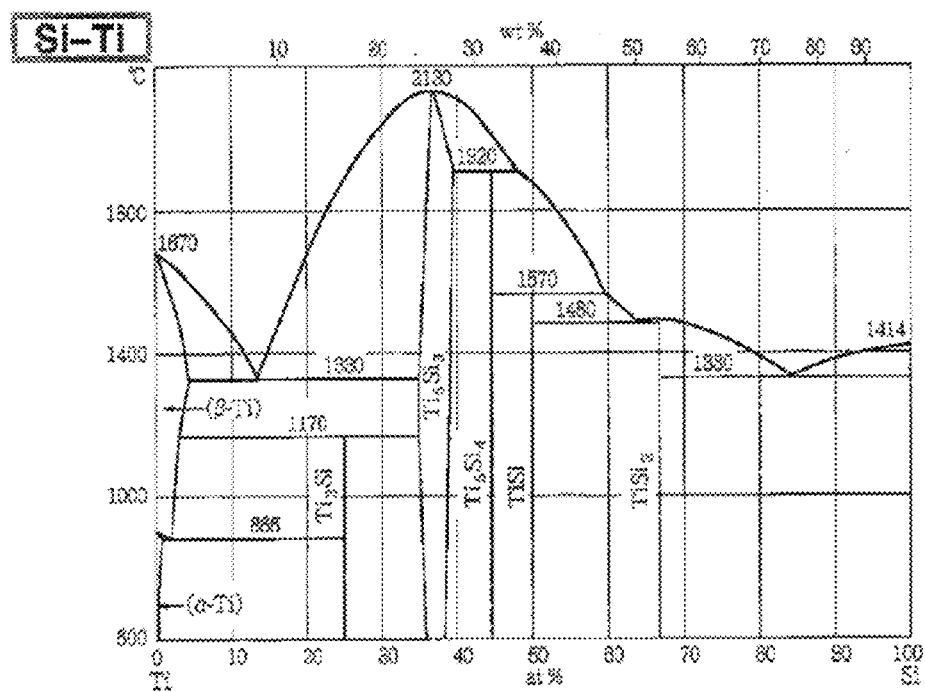
FIG. 1 is a Si—Ti binary phase diagram.

A dense composite material of the present invention contains 37% to 60% by mass of silicon carbide grains, also contains titanium silicide, titanium silicon carbide, and titanium carbide, each in an amount smaller than the mass percent of the silicon carbide grains, and has an open porosity of 1% or less. Herein, the open porosity is defined as a value measured by the Archimedean method using pure water as a medium.

The silicon carbide grains are contained in an amount of 37% to 60% by mass. Herein, the content is determined by a simplified quantitative method in which an X-ray diffraction pattern of the composite material is obtained and software for data analysis is used. When the content of the silicon carbide grains is less than 37% by mass, it is not possible to sufficiently increase the thermal conductivity, which is not desirable. When the content exceeds 60% by mass, the open porosity increases, and strength does not increase sufficiently, which is not desirable. Regarding the silicon carbide grains, preferably, 16 or more silicon carbide grains having a major axis of 10 μm or more are present in an SEM image (backscattered electron image) magnified 1,000 times of a region with a size of 90 μm (length)×120 μm (width) of the dense composite material. In this case, the composite material is sufficiently sintered and sufficiently densified.

Each of titanium silicide, titanium silicon carbide, and titanium carbide is contained in an amount smaller than the mass percent of the silicon carbide grains. Examples of titanium silicide include $TiSi_2$, $TiSi$, $Ti_5Si_4$, and $Ti_5Si_3$. Among these, $TiSi_2$ is preferable. Furthermore, $Ti_3SiC_2$ (TSC) is preferable as titanium silicon carbide, and TiC is preferable as titanium carbide. The mass percent of titanium carbide is preferably smaller than each of the mass percent of titanium silicide and the mass percent of titanium silicon carbide. The mass percent of titanium silicide is preferably larger than the mass percent of titanium silicon carbide. That is, preferably, the mass percent of silicon carbide is largest, and the mass percent decreases in the order of titanium silicide, titanium silicon carbide, and titanium carbide. For example, the silicon carbide content may be 37% to 60% by mass, the titanium silicide content may be 31% to 41% by mass, the titanium silicon carbide content may be 5% to 25% by mass, and the titanium carbide content may be 1% to 4% by mass.

Preferably, at least one of titanium silicide, titanium silicon carbide, and titanium carbide is present in spaces between silicon carbide grains so as to cover surfaces of silicon carbide grains. In the case where silicon carbide grains are highly dispersed, pores are likely to remain between silicon carbide grains. However, when the surfaces of silicon carbide grains are covered with other grains as described above, pores are likely to be filled, and a dense and high strength material is likely to be produced, which is desirable. Furthermore, in addition to covering the surfaces of silicon carbide grains, titanium carbide is preferably dispersed in the titanium silicide phase. In the structure of a composite material shown in the SEM image of FIG. 2, which will be described later, it is possible to confirm the state in which titanium carbide is dispersed in a large titanium silicide domain. In the case where the titanium silicide domain is large, there is a concern that the domain itself may become a fracture origin, resulting in a decrease in the strength of the composite material. However, it is believed that, by being dispersed in titanium silicide, titanium carbide has an effect of compensating for the strength of the titanium silicide phase, and thus high strength can be maintained as the composite material.

The dense composite material of the present invention has a coefficient of linear thermal expansion that is substantially the same as that of alumina. Therefore, in the case where a member fabricated using the dense composite material of the present invention and a member fabricated using alumina are joined (e.g., by a metal junction) to each other, even if repeatedly used at temperatures between a low temperature and a high temperature, separation is unlikely to occur. Specifically, the difference in average coefficient of linear thermal expansion at 40° C. to 570° C. between the dense composite material of the present invention and alumina is preferably 0.5 ppm/K or less. More specifically, the average coefficient of linear thermal expansion at 40° C. to 570° C. of the dense composite material of the present invention is preferably 7.2 to 8.2 ppm/K. Note that when the average coefficient of linear thermal expansion at 40° C. to 570° C. of a dense alumina sintered body, which was obtained by subjecting an alumina starting material with a purity of 99.99% or more to hot-press firing, was measured under the same conditions as those for the dense composite material of the present invention, the measurement result was 7.7 ppm/K.

The dense composite material of the present invention has excellent thermal conduction, and specifically, preferably has a thermal conductivity of 75 W/mK or more. In such a case, when a member fabricated using the dense composite material of the present invention and a member fabricated using alumina are joined by a metal junction to each other, heat possessed by alumina can be efficiently dissipated.

The dense composite material of the present invention has excellent strength, and specifically, preferably has a 4-point bending strength of 200 MPa or more. In such a case, a member fabricated using the dense composite material of the present invention can be easily applied to a cooling board or the like.

A joined body of the present invention includes a first member fabricated using the dense composite material described above, and a second member fabricated using alumina, the first member and the second member being joined (e.g., by a metal junction) to each other. Such a joined body can be applied, for example, to a component for semiconductor production equipment. Examples of the component for semiconductor production equipment include a component obtained by joining a cooling board (first member) fabricated using the dense composite material described above and an electrostatic chuck (second member) fabricated using alumina to each other using a joining material containing, as a major constituent, aluminum or an alloy thereof. Since the first member has a very small difference in coefficient of linear thermal expansion from alumina, even if the component is repeatedly used at temperatures between a low temperature and a high temperature, the first member is unlikely to be separated from the second member. Furthermore, since the first member has a sufficiently high thermal conductivity, it can efficiently cool the second member fabricated using alumina. Furthermore, since the first member has sufficiently high denseness, it permits a cooling liquid or cooling gas to pass therethrough, and the cooling efficiency can be further improved. Furthermore, since the first member has sufficiently high strength, it can sufficiently withstand stress due to a temperature difference during processing and joining in the production of the component for semiconductor production equipment, or during used as a member.

A method for producing a dense composite material of the present invention includes: (a) a step of forming a powder mixture containing 39% to 51% by mass of silicon carbide particles having an average particle size of 10 to 25 μm and at least one starting material selected so that Ti and Si are contained, in which, regarding Si originating from starting materials other than silicon carbide and Ti, the mass ratio Si/(Si+Ti) is 0.26 to 0.54; and (b) a step of sintering the powder mixture by hot pressing, in an inert atmosphere, at 1,370° C. to 1,460° C.

In the step (a), when the average particle size of the SiC starting material is less than 10 μm, the surface area of SiC particles is excessively large, which leads to insufficient densification, and there is a possibility that it will not be possible to set the open porosity to 1% or less, which is not desirable. Furthermore, when the average particle size of the SiC starting material becomes large, since the surface area of SiC particles becomes small, the denseness is improved. However, when the average particle size of the SiC starting material is excessively large, there is a possibility of insufficient strength. The grain size of the SiC shown in the SEM image of FIG. 2, which will be described later, is about 25 μm at a maximum. Therefore, it is not necessary to take the risk of using particles having an average particle size of more than 25 μm. Furthermore, when the content of silicon carbide particles in the powder mixture is less than 39% by mass, there is a possibility of not being able to sufficiently increase the thermal conductivity of the resulting composite material, which is not desirable. Furthermore, when the content is more than 51% by mass, there is a possibility that the resulting composite material will be insufficiently densified and the open porosity will exceed 1%, which is not desirable. Furthermore, examples of the at least one starting material selected so that Ti and Si are contained include a combination of metallic Ti and metallic Si, a combination of metallic Ti, metallic Si, and titanium disilicide, a combination of metallic Ti and titanium disilicide, and titanium disilicide alone. Furthermore, when the mass ratio Si/(Si+Ti) is less than 0.26, the amount of liquid phase components generated from Ti and Si components at 1,330° C. may become excessively large, or liquid phase formation may occur rapidly in large amounts, resulting in a difficulty in obtaining a good dense body by hot-press firing, which is not desirable. That is, when the firing temperature is low, densification becomes insufficient. When the firing temperature is high, the amount of exudation of liquid phase components generated in large amounts increases, and it is difficult to obtain a dense composite material with an open porosity of 1% or less. When the mass ratio Si/(Si+Ti) is more than 0.54, since the amount of liquid phase components increases, the same problem is likely to occur, which is not desirable. More preferably, the mass ratio Si/(Si+Ti) is 0.29 to 0.47.

In the step (b), examples of the inert atmosphere include a vacuum atmosphere, an argon atmosphere, a helium atmosphere, and a nitrogen atmosphere. The pressing pressure during the hot-press firing is not particularly limited, but is preferably set at 50 to 300 kgf/cm². Regarding the temperature during the hot-press firing, firing is performed at 1,370° C. to 1,460° C. When firing is performed at a temperature lower than 1,370° C., there is a possibility that the resulting composite material will be insufficiently densified and the open porosity will exceed 1%, which is not desirable. When firing is performed at a temperature higher than 1,460° C., the amount of exudation of liquid phase components increases, and it is difficult to obtain a dense composite material with an open porosity of 1% or less, which is not desirable. The firing time may be appropriately set depending on the firing conditions, and for example, may be set appropriately in a range of 1 to 10 hours.

EXAMPLES

Preferred examples of application of the present invention will be described below. As the SiC starting material, a commercially available product having a purity of 97% or more and an average particle size of 15.5 μm or 6.9 μm was used. A SiC starting material (Experimental Example 28) having an average particle size of 10.1 μm was prepared by mixing the SiC starting material with an average particle size of 15.5 μm and the SiC starting material with an average particle size of 6.9 μm at a ratio of 1:1. As the metallic Si starting material, a commercially available product having a purity of 97% or more and an average particle size of 9.0 μm was used. As the metallic Ti starting material, a commercially available product having a purity of 99.5% or more and an average particle size of 31.1 μm was used. As titanium disilicide, a commercially available product having a purity of 99% or more and an average particle size of 6.9 μm was used.

1. Production Procedure

Compounding

The SiC starting material, the metallic Si starting material, the metallic Ti starting material, and the titanium disilicide starting material were each weighed so as to satisfy the mass % shown in Table 1 or 2, and wet mixing was performed for 4 hours, using isopropyl alcohol as a solvent, using a nylon pot and nylon balls, with a diameter of 10 mm, having an iron core. After the mixing, a slurry was taken out, dried under nitrogen stream at 110° C., and then sifted through a 30-mesh sieve to obtain a powder mixture. Furthermore, it was confirmed that, in the case where about 500 g of the weighed starting materials were charged into a high-speed flow type mixer (capacity of the powder charge chamber: 1.8 L), and mixed at an agitating blade rotating speed of 1,500 rpm, the same material properties as those in the case of wet mixing could be obtained.

Forming

The powder mixture was subjected to uniaxial pressing at a pressure of 200 kgf/cm² to form a disc-shaped compact with a diameter of 50 mm and a thickness of about 17 mm, and the compact was placed in a graphite mold for firing.

Firing

The disc-shaped compact was subjected to hot-press firing to thereby obtain a dense sintered material. In the hot-press firing process, the pressing pressure was set at 200 kgf/cm², and firing was performed at the firing temperature (maximum temperature) shown in Table 1 or 2. A vacuum atmosphere was maintained until the end of firing. The retention time at the firing temperature was 4 hours.

2. Experimental Examples

Tables 1 and 2 show, for the individual Experimental Examples, a: the starting material composition (mass ratio), b: the mass ratio of Si to the sum of Si and Ti (Si/(Si+Ti)), in which Si and Ti originate from starting materials, Si, Ti, and TiSi₂, other than SiC, c: the average particle size of starting material SiC, d: hot-press firing temperature, e: presence or absence of liquid phase exudation during firing, f: the number of SiC grains having a major axis of 10 μm or more in an SEM image (backscattered electron image) magnified 1,000 times of a region with a size of 90 μm (length)×120 μm (width) of the dense composite material, g: constituent phases of the composite material and their quantitative ratio obtained from the XRD measurement results (simplified quantitative determination results), and h: basic properties (open porosity, bulk density, 4-point bending strength, coefficient of linear thermal expansion, and thermal conductivity) of the composite material. Among Experimental Examples 1 to 44, Experimental Examples 2 to 5, 7, 9 to 12, 14, 16 to 19, 22 to 25, 27, 28, 31 to 34, and 43 correspond to examples of the present invention, and the remaining Experimental Examples correspond to comparative examples.

TABLE 1

| No.: Number of Experimental example C: Comparative example E: Example | a Material composition: % by mass | | | | b Si/(Si + Ti) *SiC is excluded | c SiC average particle size (μm) | d Firing temperature (° C.) | e Exudation | f Number of SiC grains having 10 μm or more | g Constituent phase |
|---|---|---|---|---|---|---|---|---|---|---|
| | SiC | Si | Ti | TiSi$_2$ | | | | | | SiC |
| No. 1 (C1) | 44.8 | 16.4 | 38.7 | — | 0.298 | 15.5 | 1480 | Presence | 31 | 44.1 |
| No. 2 (E1) | 44.8 | 16.4 | 38.7 | — | 0.298 | 15.5 | 1460 | Absence | 34 | 42.3 |
| No. 3 (E2) | 44.8 | 16.4 | 38.7 | — | 0.298 | 15.5 | 1430 | Absence | 31 | 42.5 |
| No. 4 (E3) | 44.8 | 16.4 | 38.7 | — | 0.298 | 15.5 | 1400 | Absence | 35 | 42.2 |
| No. 5 (E4) | 44.8 | 16.4 | 38.7 | — | 0.288 | 15.5 | 1370 | Absence | 33 | 43.1 |
| No. 6 (C2) | 44.8 | 16.4 | 38.7 | — | 0.298 | 15.5 | 1350 | Absence | 30 | 42.6 |
| No. 7 (E5) | 39.8 | 17.9 | 42.3 | — | 0.298 | 15.5 | 1430 | Absence | 22 | 37.5 |
| No. 8 (C3) | 44.8 | 18.9 | 36.3 | — | 0.342 | 15.5 | 1480 | Presence | 28 | 46.8 |
| No. 9 (E5) | 44.8 | 18.9 | 36.3 | — | 0.342 | 15.5 | 1460 | Absence | 34 | 46.3 |
| No. 10 (E7) | 44.8 | 18.9 | 36.3 | — | 0.342 | 15.5 | 1430 | Absence | 24 | 46.8 |
| No. 11 (E7) | 44.8 | 18.9 | 36.3 | — | 0.342 | 15.5 | 1400 | Absence | 30 | 46.1 |
| No. 12 (E7) | 44.8 | 18.9 | 36.3 | — | 0.342 | 15.5 | 1370 | Absence | 32 | 46.5 |
| No. 13 (C4) | 44.8 | 18.9 | 36.3 | — | 0.342 | 15.5 | 1350 | Absence | 30 | 46.4 |
| No. 14 (E10) | 39.8 | 20.6 | 39.6 | — | 0.342 | 15.5 | 1430 | Absence | 21 | 40.3 |
| No. 15 (C5) | 49.5 | 20.0 | 30.5 | — | 0.396 | 15.5 | 1480 | Presence | 33 | 54.2 |
| No. 16 (E11) | 49.5 | 20.0 | 30.5 | — | 0.396 | 15.5 | 1460 | Absence | 35 | 53.9 |
| No. 17 (E12) | 49.5 | 20.0 | 30.5 | — | 0.396 | 15.5 | 1430 | Absence | 39 | 54.5 |
| No. 18 (E13) | 49.5 | 20.0 | 30.5 | — | 0.396 | 15.5 | 1400 | Absence | 36 | 54.3 |
| No. 19 (E14) | 49.5 | 20.0 | 30.5 | — | 0.396 | 15.5 | 1370 | Absence | 31 | 53.0 |
| No. 20 (C6) | 49.5 | 20.0 | 30.5 | — | 0.396 | 15.5 | 1350 | Absence | 30 | 53.1 |
| No. 21 (C7) | 42.7 | 22.7 | 34.6 | — | 0.396 | 15.5 | 1480 | Presence | 30 | 44.9 |
| No. 22 (E15) | 42.7 | 22.7 | 34.6 | — | 0.396 | 15.5 | 1460 | Absence | 29 | 45.1 |
| No. 23 (E16) | 42.7 | 22.7 | 34.6 | — | 0.396 | 15.5 | 1430 | Absence | 36 | 44.5 |
| No. 24 (E17) | 42.7 | 22.7 | 34.6 | — | 0.396 | 15.5 | 1400 | Absence | 28 | 46.9 |
| No. 25 (E18) | 42.7 | 22.7 | 34.6 | — | 0.396 | 15.5 | 1370 | Absence | 31 | 45.5 |
| No. 26 (C8) | 42.7 | 22.7 | 34.6 | — | 0.396 | 15.5 | 1350 | Absence | 30 | 45.3 |
| No. 27 (E19) | 42.7 | — | 15.3 | 42.0 | 0.396 | 15.5 | 1430 | Absence | 39 | 46.4 |

| No.: Number of Experimental example C: Comparative example E: Example | g Constituent phase | | | | | h Property | | | | |
|---|---|---|---|---|---|---|---|---|---|---|
| | TiSi$_2$ | TSC | TiC | Si | Total | Open porosity (%) | Bulk density (g/cm$^3$) | 4-point bending strength (MPa) | Coefficient of linear thermal expansion (ppm/K) | Thermal conductivity (W/mK) |
| No. 1 (C1) | 31.9 | 22.2 | 1.8 | — | 100 | 2.6 | 3.82 | 237 | 7.5 | 70 |
| No. 2 (E1) | 32.9 | 22.6 | 2.1 | — | 99.9 | 0.0 | 3.83 | 328 | 7.5 | 80 |
| No. 3 (E2) | 33.1 | 22.4 | 2.0 | — | 100 | 0.1 | 3.83 | 320 | 7.6 | 84 |
| No. 4 (E3) | 33.6 | 21.9 | 2.3 | — | 100 | 0.6 | 3.83 | 301 | 7.8 | 75 |
| No. 5 (E4) | 32.9 | 21.9 | 2.1 | — | 100 | 0.7 | 3.83 | 296 | 7.7 | 79 |
| No. 6 (C2) | 33.3 | 22.3 | 1.8 | — | 100 | 4.6 | 3.80 | 220 | 7.8 | 70 |
| No. 7 (E5) | 35.7 | 24.3 | 2.5 | — | 100 | 0.0 | 3.91 | 309 | 8.2 | 80 |
| No. 8 (C3) | 33.8 | 17.1 | 2.3 | — | 100 | 2.9 | 3.78 | 250 | 7.3 | 83 |
| No. 9 (E5) | 34.0 | 17.2 | 2.5 | — | 100 | 0.0 | 3.82 | 328 | 7.4 | 96 |
| No. 10 (E7) | 33.9 | 17.1 | 2.2 | — | 100 | 0.2 | 3.80 | 316 | 7.5 | 95 |
| No. 11 (E8) | 34.6 | 17.0 | 2.3 | — | 100 | 0.2 | 3.80 | 310 | 7.4 | 95 |
| No. 12 (E9) | 33.8 | 17.5 | 2.2 | — | 100 | 0.4 | 3.78 | 304 | 7.4 | 93 |
| No. 13 (C4) | 33.9 | 17.2 | 2.5 | — | 100 | 3.5 | 3.77 | 230 | 7.6 | 81 |
| No. 14 (E10) | 38.0 | 18.8 | 2.9 | — | 100 | 0.0 | 3.86 | 309 | 7.9 | 90 |
| No. 15 (C5) | 32.1 | 11.9 | 1.8 | — | 100 | 2.3 | 3.68 | 255 | 7.3 | 100 |
| No. 16 (E11) | 32.2 | 12.1 | 1.8 | — | 100 | 0.0 | 3.70 | 315 | 7.3 | 110 |
| No. 17 (E12) | 32.2 | 11.4 | 1.9 | — | 100 | 0.0 | 3.69 | 303 | 7.3 | 100 |
| No. 18 (E13) | 32.7 | 11.4 | 1.6 | — | 100 | 0.0 | 3.69 | 320 | 7.3 | 108 |
| No. 19 (E14) | 33.9 | 10.3 | 2.8 | — | 100 | 0.5 | 3.61 | 277 | 7.3 | 105 |
| No. 20 (C6) | 33.8 | 10.3 | 2.8 | — | 100 | 2.4 | 3.68 | 238 | 7.3 | 100 |
| No. 21 (C7) | 38.8 | 12.8 | 3.5 | — | 100 | 0.7 | 3.76 | 265 | 7.8 | 91 |
| No. 22 (E15) | 38.4 | 13.5 | 3.1 | — | 100 | 0.0 | 3.79 | 315 | 7.7 | 95 |
| No. 23 (E16) | 38.8 | 13.6 | 3.1 | — | 100 | 0.0 | 3.79 | 313 | 7.8 | 101 |

TABLE 1-continued

| | | | | | | | | | |
|---|---|---|---|---|---|---|---|---|---|
| No. 24 (E17) | 37.1 | 13.2 | 2.8 | — | 100 | 0.0 | 3.79 | 310 | 7.8 | 97 |
| No. 25 (E18) | 38.1 | 13.4 | 3.0 | — | 100 | 0.0 | 3.79 | 313 | 7.7 | 103 |
| No. 26 (C8) | 37.5 | 12.9 | 3.3 | — | 100 | 2.7 | 3.69 | 240 | 7.7 | 89 |
| No. 27 (E19) | 38.8 | 12.1 | 2.7 | — | 100 | 0.0 | 3.78 | 308 | 7.7 | 102 |

*The "—" in the column of constituent phase means undetected.

TABLE 2

| C: Comparative example | a Material composition: % by mass | | | | b Si/(Si + Ti) *SiC is excluded | c SiC average particle size (μm) | d Firing temperature (°C.) | e Exudation | f Number of SiC grains having 10 μm or more | g Constituent phase |
|---|---|---|---|---|---|---|---|---|---|---|
| E: Example | SiC | Si | Ti | TiSi$_2$ | | | | | | SiC |
| No. 28. (E20) | 42.7 | 22.7 | 34.6 | — | 0.396 | 10.1 | 1430 | Absence | 18 | 46.3 |
| No. 29 (C9) | 42.7 | 22.7 | 34.6 | — | 0.396 | 6.9 | 1430 | Absence | 0 | 47.3 |
| No. 30 (C10) | 50.7 | 23.1 | 26.2 | — | 0.468 | 15.5 | 1480 | Presence | 39 | 59.3 |
| No. 31 (E17) | 50.7 | 23.1 | 26.2 | — | 0.468 | 15.5 | 1460 | Absence | 36 | 59.3 |
| No. 32 (E19) | 50.7 | 23.1 | 26.2 | — | 0.468 | 15.5 | 1430 | Absence | 38 | 58.7 |
| No. 33 (E21) | 50.7 | 23.1 | 26.2 | — | 0.468 | 15.5 | 1400 | Absence | 38 | 58.0 |
| No. 34 (E22) | 50.7 | 23.1 | 26.2 | — | 0.468 | 15.5 | 1370 | Absence | 35 | 58.1 |
| No. 35 (C11) | 50.7 | 23.1 | 26.2 | — | 0.468 | 15.5 | 1350 | Absence | 36 | 58.5 |
| No. 36 (C12) | 51.9 | 26.3 | 21.8 | — | 0.547 | 15.5 | 1460 | Presence | 31 | 62.5 |
| No. 37 (C13) | 51.9 | 26.3 | 21.8 | — | 0.547 | 15.5 | 1430 | Presence | 33 | 57.8 |
| No. 38 (C14) | 47.4 | 30.5 | 22.1 | — | 0.580 | 15.5 | 1350 | Presence | 25 | 59.1 |
| No. 39 (C15) | 47.4 | 30.5 | 22.1 | — | 0.580 | 15.5 | 1320 | Absence | 28 | 60.1 |
| No. 40 (C16) | 42.7 | 34.8 | 22.5 | — | 0.608 | 15.5 | 1350 | Presence | 24 | 80.0 |
| No. 41 (C17) | 42.7 | 34.8 | 22.5 | — | 0.608 | 15.5 | 1320 | Absence | 22 | 60.5 |
| No. 42 (C18) | 59.5 | 16.0 | 24.5 | — | 0.306 | 15.5 | 1430 | Absence | 42 | 67.3 |
| No. 17 (E12) | 49.5 | 20.0 | 30.5 | — | 0.396 | 15.5 | 1430 | Absence | 39 | 54.5 |
| No. 23 (E16) | 42.7 | 22.7 | 34.6 | — | 0.396 | 15.5 | 1430 | Absence | 36 | 44.5 |
| No. 43 (E25) | 39.5 | 24.0 | 36.5 | — | 0.396 | 15.5 | 1430 | Absence | 20 | 42.8 |
| No. 44 (C19) | 29.5 | 27.9 | 42.6 | — | 0.396 | 15.5 | 1430 | Absence | 14 | 36.6 |

| C: Comparative example | g Constituent phase | | | | | h Property | | | | |
|---|---|---|---|---|---|---|---|---|---|---|
| E: Example | TiSi$_2$ | TSC | TiC | Si | Total | Open porosity (%) | Bulk density (g/cm$^3$) | 4-point bending strength (MPa) | Coeffcient of linear thermal expansion (ppm/K) | Thermal conductivity (W/mK) |
| No. 28. (E20) | 37.5 | 13.3 | 2.9 | — | 100 | 0.1 | 3.79 | 316 | 7.8 | 98 |
| No. 29 (C9) | 37.2 | 12.8 | 2.7 | — | 100 | 6.4 | 3.54 | 226 | 7.7 | 86 |
| No. 30 (C10) | 33.3 | 5.3 | 2.1 | — | 100 | 3.3 | 3.58 | 260 | 7.2 | 100 |
| No. 31 (E17) | 33.3 | 5.3 | 2.1 | — | 100 | 0.0 | 3.60 | 304 | 7.3 | 103 |
| No. 32 (E19) | 33.8 | 5.3 | 2.2 | — | 100 | 0.1 | 3.60 | 288 | 7.3 | 100 |
| No. 33 (E21) | 34.8 | 5.1 | 2.1 | — | 100 | 0.4 | 3.59 | 268 | 7.3 | 99 |
| No. 34 (E22) | 34.3 | 5.4 | 2.2 | — | 100 | 0.5 | 3.59 | 259 | 7.4 | 98 |
| No. 35 (C11) | 34.4 | 5.2 | 1.9 | — | 100 | 5.8 | 3.41 | 193 | 7.2 | 99 |
| No. 36 (C12) | 34.2 | 3.3 | — | — | 100 | 4.0 | 3.35 | 187 | 6.6 | 90 |
| No. 37 (C13) | 37.5 | 4.7 | — | — | 100 | 5.3 | 3.30 | 174 | 7.0 | 85 |
| No. 38 (C14) | 36.4 | 2.8 | — | 1.7 | 100 | 0.2 | 3.47 | 212 | 7.3 | 95 |
| No. 39 (C15) | 36.1 | 1.9 | — | 1.9 | 100 | 7.6 | 3.46 | 172 | 7.2 | 90 |
| No. 40 (C16) | 35.5 | 2.9 | — | 1.8 | 100 | 3.3 | 3.35 | 206 | 6.8 | 87 |
| No. 41 (C17) | 34.8 | 2.1 | — | 2.5 | 100 | 8.9 | 3.33 | 168 | 6.6 | 90 |
| No. 42 (C18) | 24.2 | 7.4 | 1.2 | — | 100 | 4.1 | 3.40 | 221 | 7.0 | 105 |
| No. 17 (E12) | 32.2 | 11.4 | 1.9 | — | 100 | 0.0 | 3.69 | 303 | 7.3 | 100 |
| No. 23 (E16) | 38.8 | 13.6 | 3.1 | — | 100 | 0.0 | 3.79 | 313 | 7.8 | 101 |
| No. 43 (E25) | 40.6 | 13.7 | 2.9 | — | 100 | 0.0 | 3.82 | 285 | 7.7 | 75 |
| No. 44 (C19) | 40.7 | 19.8 | 2.9 | — | 100 | 0.0 | 3.75 | 231 | 7.9 | 70 |

*The "—" in the column of constituent phase means undetected.

3. Simplified Quantitative Determination of Constituent Phases

The composite material was pulverized in a mortar, and the crystalline phases were identified with an X-ray diffractometer. The measurement was performed under the conditions of CuKα, 40 kV, 40 mA, and 2θ=5 to 70°, using a sealed tube-type X-ray diffractometer (D8 ADVANCE, manufactured by Bruker AXS). Furthermore, simplified quantitative determination was performed on the constituent phases. In the simplified quantitative determination, the contents of the crystalline phases in the composite material were determined on the basis of the X-ray diffraction peaks. In this determination, the crystalline phases were classified into SiC, TiSi$_2$, TSC ($Ti_3SiC_2$), TiC, and Si, and their contents were obtained by performing simplified quantitative determination. In the simplified quantitative determination, the simple profile-fitting function (FPM Eval.) of software for powder diffraction data analysis "EVA" of Bruker AXS was used. In this function, the quantitative ratio of constituent phases is calculated using the I/Icor (ratio of intensity to the diffraction intensity of corundum) of the ICDD PDF cards of the qualitatively detected crystalline phases. The PDF card numbers for the individual crystalline phases used are SiC: 00-049-1428, TiSi2: 01-071-0187, TSC: 01-070-6397, TiC: 01-070-9258 (TiC0.62), and Si: 00-027-1402.

4. Measurement of Basic Properties (1) Average Particle Size

The average particle size was measured using a Microtrac MT3300EX, manufactured by Nikkiso Co., Ltd., with pure water serving as a dispersion medium.

(2) Open Porosity and Bulk Density

The open porosity and bulk density were measured by the Archimedean method using pure water as a medium.

(3) 4-Point Bending Strength

The 4-point bending strength was determined in accordance with JIS-R1601.

(4) Coefficient of Linear Thermal Expansion (Average Coefficient of Linear Thermal Expansion at 40° C. to 570° C.)

Using a TD5020S (horizontal differential expansion measurement type) manufactured by Bruker AXS, the temperature was raised to 650° C. twice in an argon atmosphere and at a rate of temperature rise of 20° C./min, and the average coefficient of linear thermal expansion at 40° C. to 570° C. was calculated from the second measurement data. As a standard sample, an alumina standard sample (purity: 99.7%, bulk density: 3.9 g/cm$^3$, length: 20 mm) provided on the apparatus was used. Another alumina standard sample (same sample) was prepared, and the coefficient of linear thermal expansion was measured under the same conditions. The measured value was 7.7 ppm/K.

(5) Thermal Conductivity

The thermal conductivity was measured by a laser flash method.

(6) SEM Observation

SEM observation was performed on the dense composite material. In the SEM observation, a backscattered electron image of a cross section of the dense composite material was observed using an electron microscope (SEM; XL30 manufactured by Philips). The backscattered electron image was observed under the conditions of an accelerating voltage of 20 kV, and a spot size of 4.

5. Results (1) Experimental Examples 1 to 7

In each of Experimental Examples 1 to 7, the powder mixture prepared by mixing the starting materials such that the Si/(Si+Ti) value was 0.298 was subjected to hot-press firing at the temperature shown in Table 1. The SiC starting material with an average particle size of 15.5 μm was used. As a result, in the case where the firing temperature was set at 1,370° C. to 1,460° C., the resulting dense composite material had an open porosity of 1% or less and sufficiently high 4-point bending strength and thermal conductivity, in which the difference in coefficient of linear thermal expansion from alumina was 0.5 ppm/K or less (Experimental Examples 2 to 5 and 7). However, in the case where the firing temperature was set at 1,480° C., exudation occurred during hot-press firing, and the resulting composite material had an open porosity of more than 1% and insufficient denseness (Experimental Example 1). Furthermore, in the case where the firing temperature was set at 1,350° C., a non-dense composite material with an open porosity of more than 1% was obtained (Experimental Example 6). Note that the term "exudation" refers to swelling out of liquid-phase or gas-phase components generated at high temperatures from the gap of the graphite mold and sintering in that state. The occurrence of exudation may result in a deviation of the composition of the fired material and insufficient densification, and may also lead to corrosion and abrasion of the graphite mold, which is not desirable.

(2) Experimental Examples 8 to 14

In each of Experimental Examples 8 to 14, the powder mixture prepared by mixing the starting materials such that the Si/(Si+Ti) value was 0.342 was subjected to hot-press firing at the temperature shown in Table 1. The SiC starting material with an average particle size of 15.5 μm was used. As a result, in the case where the firing temperature was set at 1,370° C. to 1,460° C., the resulting dense composite material had an open porosity of 1% or less and sufficiently high 4-point bending strength and thermal conductivity, in which the difference in coefficient of linear thermal expansion from alumina was 0.5 ppm/K or less (Experimental Examples 9 to 12 and 14). However, in the case where the firing temperature was set at 1,480° C., exudation occurred during hot-press firing, and the resulting composite material had an open porosity of more than 1% and insufficient denseness (Experimental Example 8). Furthermore, in the case where the firing temperature was set at 1,350° C., a non-dense composite material with an open porosity of more than 1% was obtained (Experimental Example 13).

(3) Experimental Example 15 to 27

In each of Experimental Examples 15 to 27, the powder mixture prepared by mixing the starting materials such that the Si/(Si+Ti) value was 0.396 was subjected to hot-press firing at the temperature shown in Table 1. The SiC starting material with an average particle size of 15.5 μm was used. In Experimental Examples 15 to 26, SiC, metallic Si, and metallic Ti were used as starting materials. In Experimental Example 27, SiC, metallic Ti, and $TiSi_2$ were used as starting materials. As a result, in the case where the firing temperature was set at 1,370° C. to 1,460° C., the resulting dense composite material had an open porosity of 1% or less and sufficiently high 4-point bending strength and thermal conductivity, in which the difference in coefficient of linear thermal expansion from alumina was 0.5 ppm/K or less (Experimental Examples 16 to 19, 22 to 25, and 27). However, in the case where the firing temperature was set at 1,480° C., exudation occurred during hot-press firing, and the resulting composite material had an open porosity of more than 1% and insufficient denseness (Experimental Examples 15 and 21). Furthermore, in the case where the firing temperature was set at 1,350° C., a non-dense composite material with an open porosity of more than 1% was obtained (Experimental Examples 20 and 26). In Experimental Example 27, although different starting materials were used, a good dense composite material equivalent to the dense composite materials of Experimental Examples 22 to 25 was obtained.

(4) Experimental Examples 28 and 29

In Experimental example 28, as shown in Table 2, the SiC starting material having an average particle size of 10.1 μm prepared by mixing the SiC starting material having an average particle size of 15.5 µm and the SiC starting material having an average particle size of 6.9 µm at a ratio of 1:1 was used. The powder mixture prepared by mixing the starting materials such that the Si/(Si+Ti) value was 0.396 was subjected to hot-press firing at 1,430° C. As a result, the resulting dense composite material had an open porosity of 1% or less and sufficiently high 4-point bending strength and thermal conductivity, in which the difference in coefficient of linear thermal expansion from alumina was 0.5 ppm/K or less. In Experimental Example 29, as shown in Table 2, using SiC having an average particle size of 6.9 µm, the powder mixture prepared by mixing the starting materials such that the Si/(Si+Ti) value was 0.396 was subjected to hot-press firing at 1,430° C. As a result, a non-dense composite material with an open porosity of more than 1% was obtained. This shows that in order to obtain a dense composite material, it is necessary to set the average particle size of the SiC starting material to 10 µm or more.

(5) Experimental Examples 30 to 35

In each of Experimental Examples 30 to 35, the powder mixture prepared by mixing the starting materials such that the Si/(Si+Ti) value was 0.468 was subjected to hot-press firing at the temperature shown in Table 2. The SiC starting material with an average particle size of 15.5 µm was used. As a result, in the case where the firing temperature was set at 1,370° C. to 1,460° C., the resulting dense composite material had an open porosity of 1% or less and sufficiently high 4-point bending strength and thermal conductivity, in which the difference in coefficient of linear thermal expansion from alumina was 0.5 ppm/K or less (Experimental Examples 31 to 34). However, in the case where the firing temperature was set at 1,480° C., exudation occurred during hot-press firing, and the resulting composite material had an open porosity of more than 1% and insufficient denseness (Experimental Example 30). Furthermore, in the case where the firing temperature was set at 1,350° C., a non-dense composite material with an open porosity of more than 1% was obtained (Experimental Example 35).

(6) Experimental Examples 36 to 41

In Experimental Examples 36 to 41, as shown in Table 2, the powder mixtures prepared by mixing the starting materials such that the Si/(Si+Ti) value was more than 0.54 were subjected to hot-press firing at different temperatures. The SiC starting material with an average particle size of 15.5 µm was used. As a result, in the case where hot-press firing was performed at 1,350° C. or higher, exudation occurred during firing. Furthermore, except for Experimental Example 38, non-dense composite materials with an open porosity of more than 1% were obtained. These composite materials did not contain TiC as a constituent phase, and some of them contained Si instead. Furthermore, the 4-point bending strength was generally low. Furthermore, when comparison was made between Experimental Example 37 and Experimental Example 35 described above, both had a high porosity, but Experimental Example 35 containing TiC as a constituent phase had a higher bending strength. The reason for this is believed to be that since TiC is dispersed in titanium silicide, the strength is increased.

(8) Experimental Examples 42 to 44, 17, and 23

In Experimental Examples 42 to 44, 17, and 23, as shown in Table 2, the powder mixtures prepared by mixing the starting materials such that the Si/(Si+Ti) value was 0.396 were subjected to hot-press firing at 1,430° C. However, the amounts (mass percent) of SiC, metallic Si, and metallic Ti used as starting materials were different. As a result, in the case where the amount of the SiC starting material exceeded 59% by mass, although the resulting composite material contained more than 60% by mass of SiC grains and had sufficiently high 4-point bending strength and thermal conductivity, it was a non-dense material with an open porosity of more than 1%, in which the difference in coefficient of linear thermal expansion from alumina was more than 0.5 ppm/K (Experimental Example 42). On the other hand, in the case where the amount of the SiC starting material was less than 30% by mass, the resulting composite material contained less than 37% by mass of SiC grains, and the thermal conductivity was not sufficiently high (Experimental Example 44). In contrast, in the case where the mass percent of the SiC starting material was in an appropriate range, the resulting dense composite material had an open porosity of 1% or less and sufficiently high 4-point bending strength and thermal conductivity, in which the difference in coefficient of linear thermal expansion from alumina was 0.5 ppm/K or less (Experimental Examples 43, 17, and 23).

(9) Summary

In the dense composite materials obtained in Experimental Examples 2 to 5, 7, 9 to 12, 14, 16 to 19, 22 to 25, 27, 28, 31 to 34, and 43, the difference in coefficient of linear thermal expansion from alumina is 0.5 ppm/K or less, and the thermal conductivity, denseness, and strength are sufficiently high. Consequently, regarding a component for semiconductor production equipment in which a first member composed of such a dense composite material and a second member composed of alumina are joined to each other by a metal junction, even if it is repeatedly used at temperatures between a low temperature and a high temperature, the first member and the second member are not separated from each other, and thus, the service life is prolonged. Furthermore, regarding these Experimental Examples (corresponding to examples of the present invention), the amount of SiC in the starting material composition for obtaining the dense composite material is in a rage of 39% to 51% by mass, and the amount of SiC grains in the dense composite material is in a range of 37% to 60% by mass.

6. Joined Body (1) Onto the dense composite material sample (diameter: 50 mm, thickness: 8 mm) obtained in each of Experimental Example 7 and Experimental Example 17, a metal foil with a thickness of 200 µm mainly composed of aluminum (the same length and width as those of the sample), and a dense alumina sintered body with a thickness of 5 mm were stacked in that order, and each of the stacked bodies were placed in a graphite mold for firing. Hot-press firing was performed at a pressure of 100 kgf/cm$^2$ in a vacuum at 600° C. Thereby, joined bodies (metal joined bodies) which had no separations or voids at the interfaces were obtained.

(2) A powder mixture having the starting material composition of each of Experimental Example 7 and Experimental Example 17 was subjected to uniaxial pressing at a pressure of 200 kgf/cm$^2$ to form a disc-shaped compact with a diameter of 50 mm and a thickness of about 10 mm. A dense alumina sintered body with a diameter of 50 mm and a thickness of about 5 mm was stacked on each of the resulting compacts, and the stacked bodies were placed in a graphite mold for firing. Hot-press firing was performed at a pressure of 200 kgf/cm² in a vacuum at 1,430° C. Thereby, joined bodies (directly joined bodies) which had no separations or voids at the interface were obtained.

(3) A powder mixture having the starting material composition of each of Experimental Example 7 and Experimental Example 17 was subjected to uniaxial pressing at a pressure of 200 kgf/cm² to form a disc-shaped compact with a diameter of 50 mm and a thickness of about 10 mm. Subsequently, alumina powder having a purity of 99.99% or more and an average particle size of 1 μm or less was subjected to uniaxial pressing at a pressure of 100 kgf/cm² to form a disc-shaped compact with a diameter of 50 mm and a thickness of about 10 mm. The compact with the starting material composition of each of Experimental Example 7 and Experimental Example 17 and the compact of the alumina powder were stacked together, and the stacked bodies were placed in a graphite mold for firing. Hot-press firing was performed at a pressure of 200 kgf/cm² in a vacuum at 1,430° C. Thereby, joined bodies (directly joined bodies) in which the dense composite material of Experimental Example 7 or Experimental Example 17 was stacked on the dense alumina and which had no separations or voids at the interface were obtained. Furthermore, in the case where a starting material in which magnesium oxide, magnesium fluoride, or a rare-earth fluoride was added as a sintering aid to the alumina powder in an amount of 1% by weight or less relative to the total amount of alumina was used, the similar joined body was obtained.

7. Discussion (1) Average Particle Size of SiC Starting Material

It has been confirmed that in obtaining a dense composite material, the average particle size of the SiC starting material is preferably 10 to 25 μm. When the average particle size of the SiC starting material is less than 10 μm, since the percentage of SiC particles having a small particle size increases, the surface area of SiC particles becomes excessively large, which leads to insufficient densification, and there is a possibility that it will not be possible to set the open porosity to 1% or less (Experimental Example 29). Note that, since SiC serves as an aggregate and reacts with other components on the surface of SiC, the average grain size of sintered SiC is slightly smaller than the average particle size of the SiC starting material. When the average particle size of the SiC starting material becomes large, since the surface area of SiC particles becomes small, the denseness is improved. However, when the average particle size of the SiC starting material is excessively large, there is a possibility of insufficient strength. The grain size of the SiC shown in the SEM image of FIG. 2, which will be described later, is about 25 μm at a maximum. Therefore, it is not necessary to take the risk of using particles having an average particle size of more than 25 μm.

(2) Constituent Phase

In obtaining a dense composite material, it is required that the dense composite material contain, as constituent phases, 37% to 60% by mass of SiC grains, and $TiSi_2$, TSC, and TiC, each in an amount smaller than the mass percent of SiC grains. When the content of SiC grains was more than 60% by mass, a non-dense material with an open porosity of more than 1% was produced, and a composite material in which the difference in coefficient of linear thermal expansion from alumina was 0.5 ppm/K or more was obtained (Experimental Example 42). When the content of SiC grains was less than 37% by mass, the thermal conductivity was not sufficiently high (Experimental Example 44).

(3) Si/(Si+Ti)

Regarding the mass ratio b, i.e., Si/(Si+Ti), shown in Tables 1 and 2, a Si—Ti binary phase diagram is shown in FIG. 1. The Si/(Si+Ti) corresponds to the upper horizontal axis of the phase diagram. The Si/(Si+Ti) value is preferably in an appropriate range of 0.26 to 0.54 (26 wt % to 54 wt % in the upper horizontal axis of FIG. 1). When the appropriate range is satisfied, titanium silicides represented by chemical formulae $TiSi_2$, TiSi, $Ti_5Si_4$, and $Ti_5Si_3$ are generated at a given ratio during firing. Consequently, these titanium silicides and the surfaces of SiC particles react with each other to form titanium disilicide, titanium silicon carbide, and titanium carbide (TiCx).

When the Si/(Si+Ti) value is out of the appropriate range, namely, more than 0.54 or less than 0.26, as is evident from the binary phase diagram, the amount of liquid phase components generated from Ti and Si components at 1,330° C. may become excessively large, or liquid phase formation may occur rapidly in large amounts, resulting in a difficulty in obtaining a good dense body by hot-press firing, which is not desirable. That is, when the firing temperature is low, densification becomes insufficient. When the firing temperature is high, the amount of exudation of liquid phase components generated in large amounts increases, and it is difficult to obtain a dense composite material with an open porosity of 1% or less. Furthermore, in this range, when high-volume production is required, it is not possible to secure a temperature width at which sintering is possible (for example, 30° C. or higher), which is not desirable. Specifically, as in Experimental Examples 36 to 41, when the Si/(Si+Ti) exceeded the upper limit of the appropriate range, TiC was not generated during firing, and exudation was observed in many cases. Furthermore, the resulting composite materials had an open porosity of more than 1%, or a 4-point bending strength of less than 200 MPa. When the Si/(Si+Ti) was in the appropriate range, as long as the firing temperature was in the range of 1,370° C. to 1,460° C., exudation did not occur during hot-press firing.

(4) Firing Temperature

When the firing temperature exceeded 1,460° C., even if the starting material composition was appropriate, the open porosity exceeded 1%, and densification did not occur (Experimental Examples 1, 8, 15, 21, and 30). The reason for this is believed to be that exudation occurred during hot-press firing. On the other hand, when the firing temperature was lower than 1,370° C., even if the starting material composition was appropriate, the open porosity also exceeded 1%, and densification did not occur (Experimental Examples 6, 13, 20, 26, and 35). Thus, it has been confirmed that the firing temperature is suitably 1,370° C. to 1,460° C.

(5) SEM Image (Backscattered Electron Image)

Figure 2:
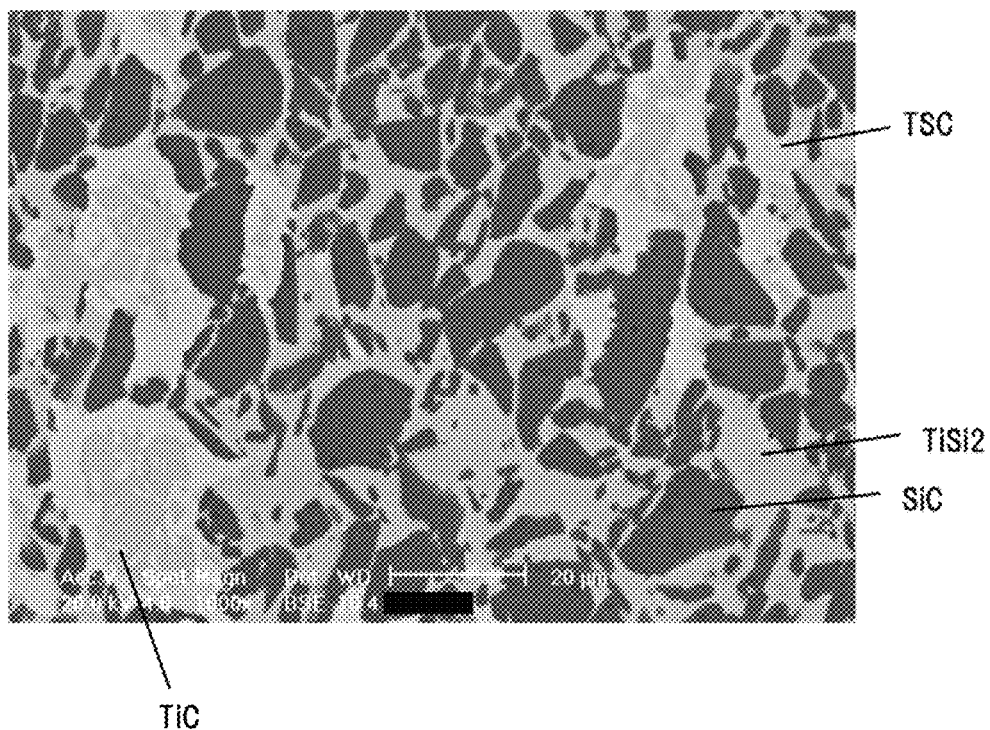
FIG. 2 is an SEM image (backscattered electron image) of a dense composite material obtained in Experimental Example 2.

FIG. 2 is a backscattered electron image in Experimental Example 2. This is an SEM image (backscattered electron image) magnified 1,000 times of a region with a size of 90 μm (length)×120 μm (width) of a polished cross section of the dense composite material. In FIG. 2, dark gray grains are SiC grains, gray structures between SiC grains are $TiSi_2$, light gray structures between SiC grains are TSC, and columnar structures dispersed in $TiSi_2$ are TiC (with the same brightness level as that of TSC). As is obvious from FIG. 2, the surfaces of SiC grains are covered with at least one of TSC, $TiSi_2$, and TiC. From FIG. 2, regarding SiC grains which are wholly within the field of vision, the major axis (maximum diameter of the grain) was obtained. As a result, the number of SiC grains having a major axis of 10 μm or more was 34. Regarding other Experimental Examples corresponding to examples of the present invention, backscattered electron images were taken, and the number of SiC grains having a major axis of 10 μm or more was counted. As shown in Tables 1 and 2, the results were 16 or more.

The present invention is not limited to the above-described embodiment. It is clear that the present invention can be implemented in a variety of embodiments without departing from the technical scope thereof.

The present application claims priority on the basis of the Japanese Patent Application No. 2013-52866 filed on Mar. 15, 2013, the entire contents of which are incorporated herein by reference.

INDUSTRIAL APPLICABILITY

The dense composite material of the present invention is, for example, used for a cooling board to be joined by a metal junction to an electrostatic chuck, a susceptor, or the like composed of alumina.

What is claimed is:

1. A dense composite material comprising:
   37% to 60% by mass of silicon carbide grains; and
   titanium silicide, titanium silicon carbide, and titanium carbide, each in an amount smaller than the mass percent of the silicon carbide grains,
   wherein the dense composite material has an open porosity of 1% or less.

2. The dense composite material according to claim 1, wherein the mass percent of titanium carbide is smaller than each of the mass percent of the titanium silicide and the mass percent of the titanium silicon carbide.

3. The dense composite material according to claim 1, wherein the mass percent of the titanium silicide is larger than the mass percent of the titanium silicon carbide.

4. The dense composite material according to claim 1, wherein at least one of the titanium silicide, the titanium silicon carbide, and the titanium carbide is present in spaces between the silicon carbide grains so as to cover surfaces of the silicon carbide grains.

5. The dense composite material according to claim 1, wherein the titanium carbide is dispersed in the titanium silicide.

6. The dense composite material according to claim 1, wherein the titanium silicide is $TiSi_2$.

7. The dense composite material according to claim 1, wherein the difference in average coefficient of linear thermal expansion at 40° C. to 570° C. between the dense composite material and alumina is 0.5 ppm/K or less.

8. The dense composite material according to claim 1, wherein the average coefficient of linear thermal expansion at 40° C. to 570° C. is 7.2 to 8.2 ppm/K.

9. The dense composite material according to claim 1, wherein the dense composite material has a thermal conductivity of 75 W/mK or more.

10. The dense composite material according to claim 1, wherein the dense composite material has a 4-point bending strength of 200 MPa or more.

11. The dense composite material according to claim 1, wherein the number of silicon carbide grains having a major axis of 10 μm or more is 16 or more in an SEM image (backscattered electron image) magnified 1,000 times of a region with a size of 90 μm (length)×120 μm (width) of the dense composite material.

12. A joined body comprising a first member composed of the dense composite material according to claim 1 and a second member composed of alumina, the first member and the second member being joined to each other.

13. The joined body according to claim 12, wherein the first member and the second member are joined to each other by a metal junction.

14. A component for semiconductor production equipment comprising the joined body according to claim 12.

15. A method for producing a dense composite material comprising:
   (a) a step of forming a powder mixture containing 39% to 51% by mass of silicon carbide particles having an average particle size of 10 to 25 μm and at least one starting material selected so that Ti and Si are contained, in which, regarding Si originating from starting materials other than silicon carbide and Ti, the mass ratio Si/(Si+Ti) is 0.26 to 0.54; and
   (b) a step of sintering the powder mixture by hot pressing, in an inert atmosphere, at 1,370° C. to 1,460° C. to obtain the dense composite according to claim 1.

* * * * *